(12) United States Patent
Chrzanowski et al.

(10) Patent No.: US 6,488,198 B1
(45) Date of Patent: Dec. 3, 2002

(54) WIRE BONDING METHOD AND APPARATUS

(75) Inventors: Douglas E. Chrzanowski, Owego, NY (US); John A. Welsh, Easley, SC (US); James W. Wilson, Vestal, NY (US); Jeffrey A. Zimmerman, Manassas, VA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/347,580

(22) Filed: Jul. 1, 1999

(51) Int. Cl.$^7$ .............................................. B23K 31/02
(52) U.S. Cl. .................... 228/106; 228/180.5
(58) Field of Search .................. 228/106, 5.5, 180.5, 228/6.2, 44.7; 156/583.3; 428/332, 338, 339, 901

(56) References Cited

U.S. PATENT DOCUMENTS

| | | |
|---|---|---|
| 4,848,639 A | 7/1989 | Belanger, Jr. |
| 4,931,355 A * | 6/1990 | Radwanski et al. |
| 5,092,510 A | 3/1992 | Anstrom et al. |
| 5,517,291 A * | 5/1996 | Montfort et al. |
| 5,562,948 A | 10/1996 | Trepte et al. |
| 5,670,262 A * | 9/1997 | Dalman |
| 5,965,245 A * | 10/1999 | Okano et al. |
| 6,064,111 A * | 5/2000 | Sota et al. |
| 6,136,137 A * | 10/2000 | Farnworth et al. |
| 6,156,421 A * | 12/2000 | Stopper et al. |

FOREIGN PATENT DOCUMENTS

| | | |
|---|---|---|
| DE | 3716531 | 10/1988 |
| JP | 1222950 | 12/1987 |
| JP | 62294546 | 12/1987 |
| SU | 1062233 | 12/1983 |

* cited by examiner

Primary Examiner—Tom Dunn
Assistant Examiner—Jonathan Johnson
(74) Attorney, Agent, or Firm—Salzman & Levy; Lawrence R. Fraley

(57) ABSTRACT

A process and apparatus are described for wire bonding circuit pads of large scale integrated design. The bonding process employs a capillary tool that applies heat and pressure to the wires in order to bond them to the circuit pad. The circuit pad is supported upon a closed woven, fiberglass mesh, which supports the circuit pad during the bonding process.

3 Claims, 5 Drawing Sheets

WIRE BONDING METHOD AND APPARATUS

FIELD OF THE INVENTION

The present invention relates to large scale integrated circuit manufacture and, more particularly, to an improved method and apparatus for bonding circuitry to a circuit pad supported by an improved base laminate that increases the resistance of the circuitry to deform.

BACKGROUND OF THE INVENTION

In recent times, as large scale integrated circuits have become denser, the copper circuitry in the pads have become ever thinner. Working with such thin circuitry, placing and attaching them to appropriate sites, has thus become ever more challenging.

During assembly, the pads are supported by a mesh laminate, while a capillary tool is used to attach the fine wiring onto the pads. As the tip of the capillary tool wipes across the surface of the pad in order to clean it, then applies energy in the form of heat, pressure and vibration, or any combination thereof, while pushing the circuitry to bond or weld the wires to the pad, it has been discovered that pads collapse or deform. The collapse of the pads is due to the interaction of the gold wire thickness, copper hardness, total pad thickness, force of the capillary tool, and material construction of the base laminate. Previous solutions to this problem involved changing the wire bonding parameters, but this had the disadvantage of producing a weaker bonded product or, in fact, no bond at all.

Copper pads have reached a thickness of less than 0.7 mils in order to provide for finer circuit lines and greater density. Experiments revealed that with the gold and nickel parameters of the pad being held constant, changing the base laminate could resolve the problem.

After pad collapse, windows of relatively thick resin had been observed in the open weave of the laminate, where the glass strands of the laminate supported the pad. This led to the conclusion that changing the laminate from an open weave to a closed weave could decrease or eliminate the likelihood of pad collapse.

It was discovered that the closed weave laminate improved the interaction of the pad thickness, such that copper thicknesses as low as 0.4 mils could be used without pad failure. The inventive process reflects the discovery that mesh with a separation dimension between warp or weave strands, measured lengthwise through the laminate, must be less than or equal to the diameter of the gold wires, in order to avoid pad collapse. The closed weave of the laminate was observed to improve the interaction of the pad thickness for thinner applications.

DISCUSSION OF RELATED ART

In U.S. Pat. No. 4,848,639, issued on Jul. 18, 1989 to Belanger, Jr. for COMPLIANT PAD FOR USE IN TAPE AUTOMATED BONDING PROCESS, a work piece used in bonding the inner leads of an integrated circuit is illustrated. The work piece is constructed of a metallic base layer to which a compliant pad is affixed. A gas channel is provided for a source of heated nitrogen. A ceramic layer is positioned over the gas channel to provide for heat distribution and support of the integrated circuit during its bonding to an associated tape.

In U.S. Pat. No. 5,092,510, issued on Mar. 3, 1992 to Anstrom et al. for METHOD AND APPARATUS FOR CIRCUIT BOARD SUPPORT DURING COMPONENT MOUNTING, a temporary support fixture is depicted for mounting components to selected locations on a circuit board. The fixture features a flexible support to provide for variations and tolerance differences between the circuit board and placement head.

In U.S. Pat. No. 5,562,948, issued to Trepte et al. on Oct. 8, 1996 for METHOD AND APPARATUS FOR PRODUCING AN ELECTRICALLY CONDUCTIVE WALL FROM A FABRIC AND A SHEET MATERIAL, a fabric and film are provided with an insulating coating in the production of flexible containers.

In Japanese Publication No. JP 1222950, a laminated board is shown with a conventional glass cloth, epoxy resin and inorganic filler, used in printed circuit boards.

In Japanese Publication No. JP 62294546, a laminate is formed by impregnating a fluoro-resin fabric with a resin varnish comprising a polyimide or epoxy resin.

In German Publication No. DE 3716531, a laminated material is formed in a continuous process by passing a resin impregnated fabric and copper foil between a sandwiching set of rollers.

In Publication No. SU 1062233, a resin impregnated, heat resistant fabric laminate is fabricated from an arylene-phenol-formaldehyde resin, an epoxy-triphenol resin, a tris-(dimethyl aminomethyl)-phenol, and an organic solvent.

SUMMARY OF THE INVENTION

In accordance with the present invention, there is provided a process and apparatus for bonding circuitry to a circuit pad in large scale integrated circuitry. The circuit pad is supported by a closed weaved laminate base that increases the resistance of the pad to deform during the wire bonding process. The laminate comprises a woven, fiberglass mesh having a separation dimension between warp or weave strands, measured lengthwise through the laminate, less than or equal to that of the diameter of the gold wires that are being bonded to the copper pad. The diameter of the gold bonding wire is generally less than approximately 1.0 mil. The improved laminate base can accommodate circuit devices having copper pads whose thicknesses are as low as 0.4 mils, without pad deformation.

It is an object of this invention to provide an improved method and apparatus for fabricating circuit devices.

It is another object of the invention to provide an improved supporting base laminate in a wire bonding process in the manufacture of large scale integrated circuits.

BRIEF DESCRIPTION OF THE DRAWINGS

A complete understanding of the present invention may be obtained by reference to the accompanying drawings, when considered in conjunction with the subsequent detailed description, in which.

DESCRIPTION OF THE PREFERRED EMBODIMENT

Generally speaking, the invention features a process and apparatus for wire bonding large scale integration circuit devices. The bonding process employs a capillary tool that applies heat and pressure to the wires in order to bond or weld them to a circuit pad. The circuit pad is supported upon a closed woven, fiberglass mesh, which supports the pad during the bonding process.

Figure 1:
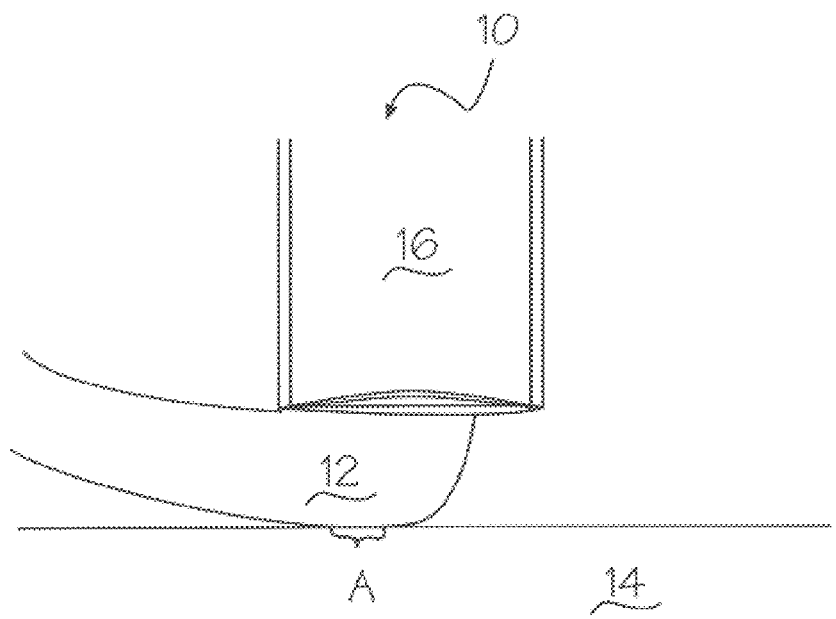
FIG. 1 illustrates a schematic diagram of the apparatus used in the wire bonding process of this invention, featuring the area of pad collapse.
Figure 2:
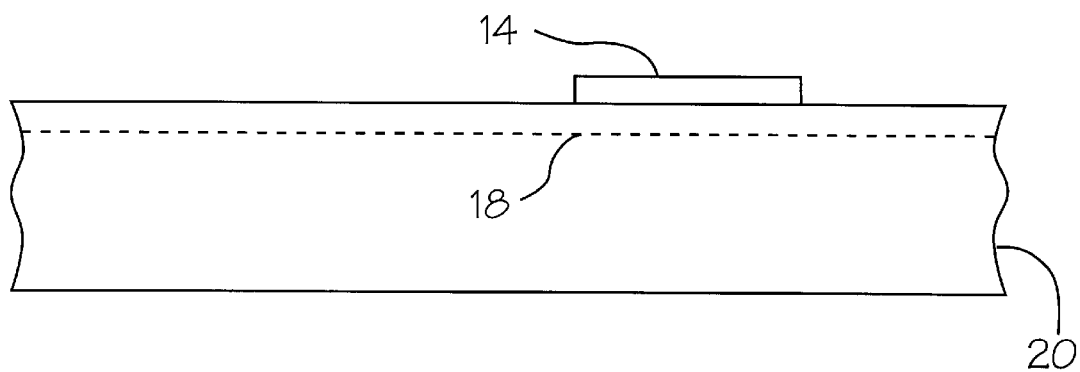
FIG. 2 shows a schematic, cross-sectional view of the base support of the apparatus of FIG. 1.

Now referring to FIG. 1, a schematic view of the apparatus 10 used in the bonding process of this invention is illustrated. A gold wire 12 is shown being bonded to the circuit pad 14 by a capillary tool 16, whose tip is approximately 6 to 10 mils in diameter. The circuit pad 14 is approximately 50 mils thick. The circuit pad 14 rests upon a laminate mesh 18 which, in turn, is supported by a substrate 20, depicted in FIG. 2. The mesh is between approximately 2.5 to 4.0 mils thick.

Figure 3:
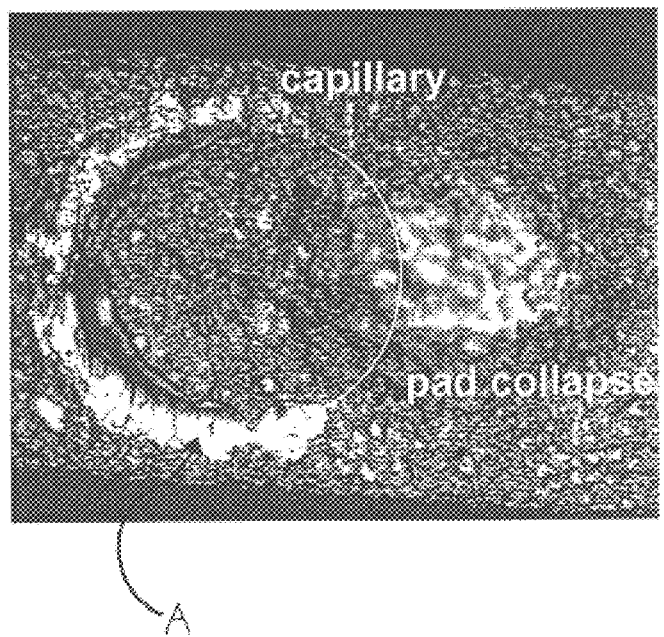
FIG. 3 depicts a plan view image of an actual collapse of a circuit pad using a prior art laminate mesh.
Figure 4:
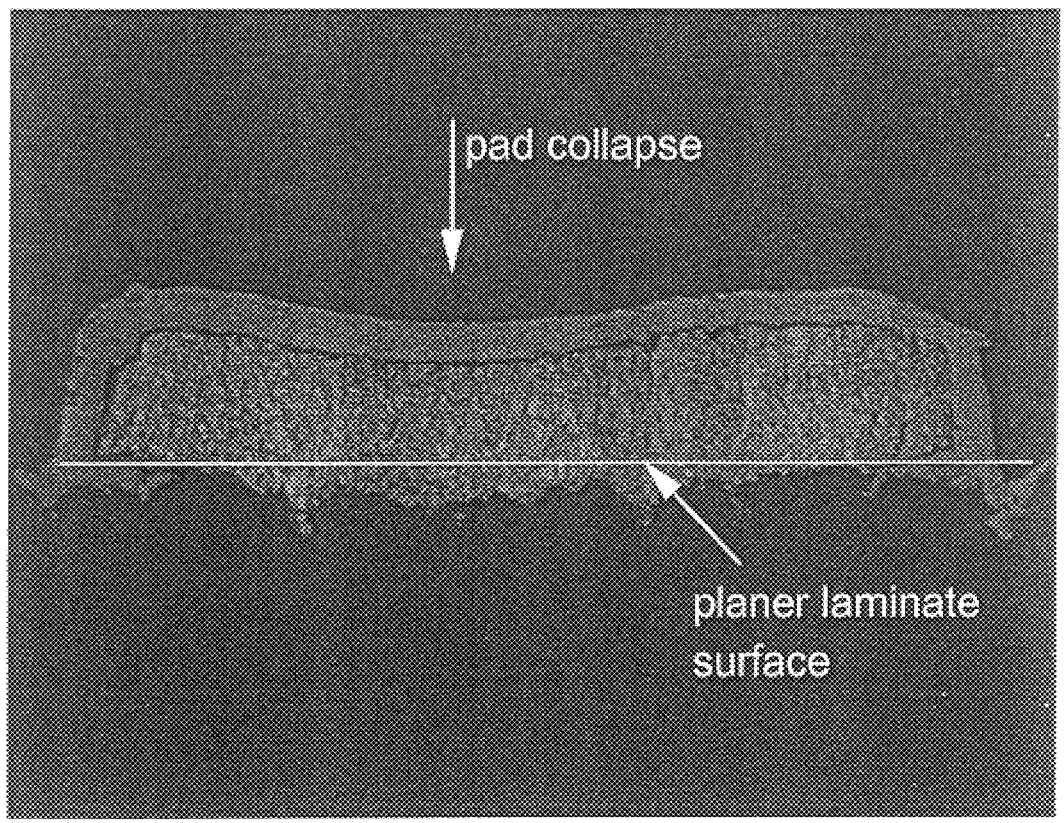
FIG. 4 shows a sectional view image of an actual collapse of a circuit pad using a prior art laminate.
Figure 5:
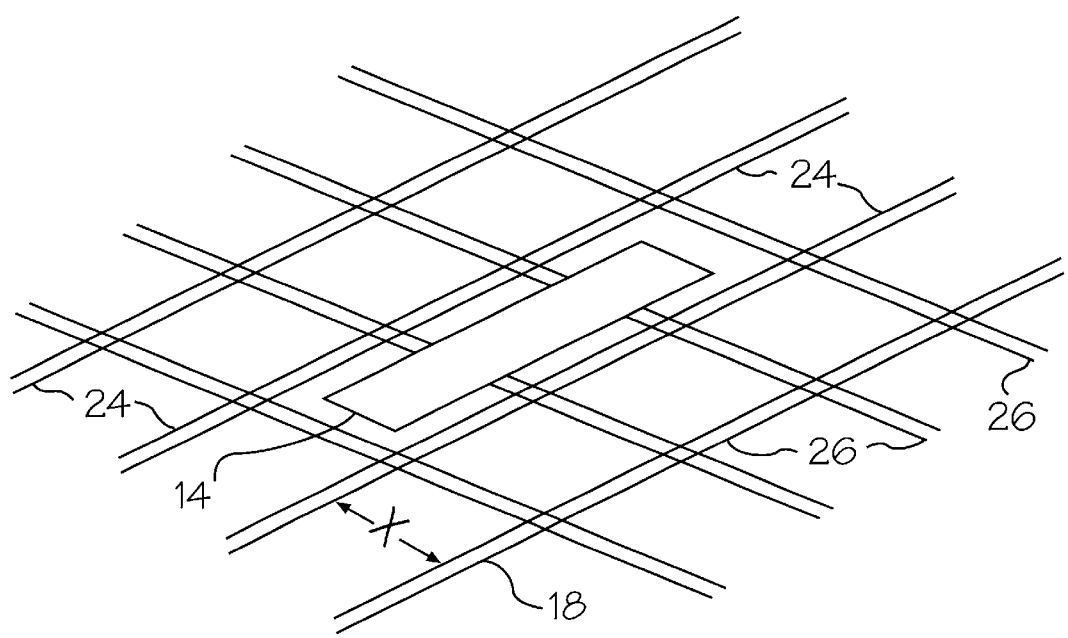
FIG. 5 illustrates a schematic, in situ view of the circuit pad disposed upon a supporting mesh of the prior art.

In the prior art, the circuit pad 14 was supported upon a laminate base, or mesh 18, of the type shown in FIG. 5. The prior art supporting mesh 18 comprised an open weave, which did not adequately support the circuit pad 14, and which resulted in collapse of the pad 14 about the area designated A. Photographs of the collapsed area A, in plan and sectional views, is shown in FIGS. 3 and 4, respectively.

Figure 6:
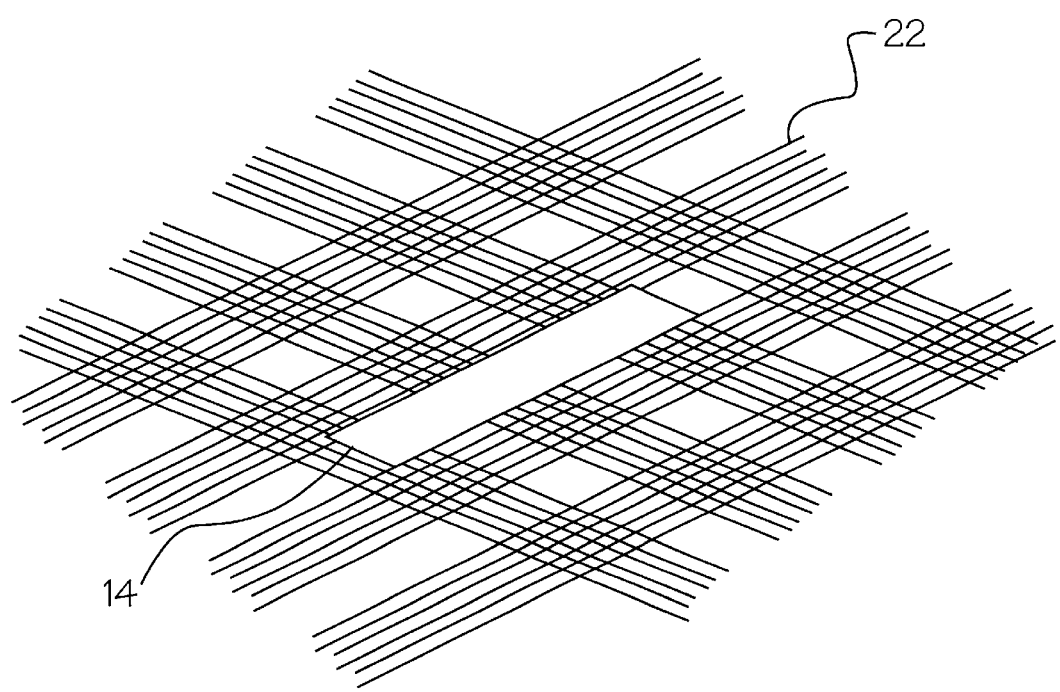
FIG. 6 illustrates a schematic, in situ view of the circuit pad disposed upon the supporting mesh of this invention.

It has now been discovered that a closed woven mesh 22 of the type that is schematically shown in FIG. 6, can adequately support the pad 14 from collapse during the wire bonding process.

The mesh 18 of the invention comprises a woven fiberglass having a separation dimension "X" (FIG. 5), measured lengthwise, between warp or weave strands 24 or 26, of no more than the diameter (thickness) of the gold wires of the circuit pad 14. The diameter of the wires of the circuit pad 14 is generally about 1.0, but can even be less than 0.7 mils. The improved mesh base can accommodate circuit pads having wires whose thicknesses are as low as 0.2 mils, without circuit pad deformation. The fiberglass mesh of this invention can be purchased from Clark-Schwebel, Inc., of Anderson, S.C., and is sold as Model No. 2116.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method for supporting a circuit pad during wire bonding, comprising the steps of:

a) applying a capillary tool to wire that is to be bonded to a circuit pad; and b) supporting said circuit pad upon a closed woven mesh whose separation distance between woven strands is less than or equal to a diameter of said wire.

2. The method of claim 1, wherein said separation distance is approximately equal to or less than 0.7 mils.

3. The method of claim 1, wherein said separation distance is between approximately 0.2 and 0.7 mils.

* * * * *